United States Patent [19]

Nishikawa

[11] Patent Number: 5,492,866
[45] Date of Patent: Feb. 20, 1996

[54] PROCESS FOR CORRECTING WARPED SURFACE OF PLASTIC ENCAPSULATED SEMICONDUCTOR DEVICE

[75] Inventor: Hideyuki Nishikawa, Tokyo, Japan

[73] Assignee: NEC Corporation, Tokyo, Japan

[21] Appl. No.: 100,323

[22] Filed: Aug. 2, 1993

[30] Foreign Application Priority Data

Jul. 31, 1992 [JP] Japan ..................................... 4-205164

[51] Int. Cl.⁶ .......................... H01L 21/56; H01L 21/603; H01L 21/68; H01L 21/70
[52] U.S. Cl. ........................... 437/207; 437/212; 437/214; 437/216; 437/248; 437/249; 437/923
[58] Field of Search .................................. 437/207, 212, 437/214, 216, 923, 248, 249; 100/141, 93 R, 93 P, 138, 139, 224, 226, 207; 29/25.01

[56] References Cited

U.S. PATENT DOCUMENTS 4,863,547 9/1989 Shidahara et al. ..................... 156/345
5,132,779 7/1992 Osada et al. .............................. 357/74
5,297,480 3/1994 Miyashita et al. ..................... 100/93 P

FOREIGN PATENT DOCUMENTS

| 56-55057 | 5/1981 | Japan | ..................................... 437/212 |
| 60-53036 | 5/1985 | Japan | ..................................... 437/249 |
| 157630 | 3/1989 | Japan . | |
| 2105447 | 4/1990 | Japan | ..................................... 437/214 |
| 2146753 | 6/1990 | Japan | ..................................... 29/25.01 |
| 2197399 | 8/1990 | Japan | ..................................... 100/224 |

Primary Examiner—Mary Wilczewski
Assistant Examiner—David E. Graybill
Attorney, Agent, or Firm—Young & Thompson

[57] ABSTRACT

A process for correcting the warped surface of a plastic encapsulated semiconductor lead frame device. The semiconductor device is placed on a transporting plate and transported to a heating device. The semiconductor device and the transporting device are clamped between a pair of heating plates and heated. Then the semiconductor device and the transporting plate are removed from the device and clamped between a pair of cooling plates and cooled. The warp is corrected to a substantially flat surface.

9 Claims, 7 Drawing Sheets

FIG.11

PROCESS FOR CORRECTING WARPED SURFACE OF PLASTIC ENCAPSULATED SEMICONDUCTOR DEVICE

BACKGROUND OF THE INVENTION

1. Field of the Invention

The present invention relates to a method of manufacturing a plastic seal semiconductor device and an apparatus for performing the same method.

2. Description of the Related Art

A plastic seal semiconductor device is manufactured by mounting a semiconductor element on an element mounting portion of a lead frame, connecting top ends of metal thin wires to the element, holding the lead frame within a resin mold and injecting plastic material into the mold to seal the semiconductor element mounted on the lead frame, the thin metal wires and internal leads together.

According to a conventional technique, an individual semiconductor device is manufactured by, after aging for stabilizing the plastic material, removing tie-bars and unnecessary plastic portion of the seal, processing external leads by such as plating them with solder, separating the semiconductor device from the lead frame and shaping the external leads to predetermined configuration.

Figure 1A:
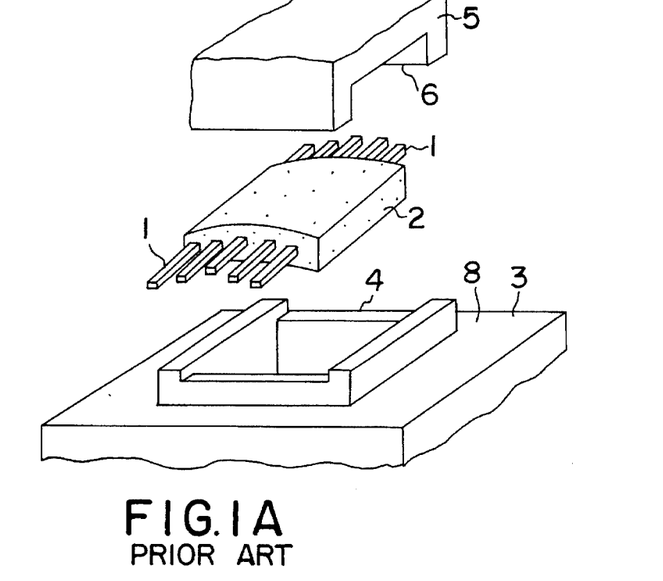
FIG. 1A is a perspective view of a shaping mold for shaping external leads and a semiconductor device before shaping.
Figure 1B:
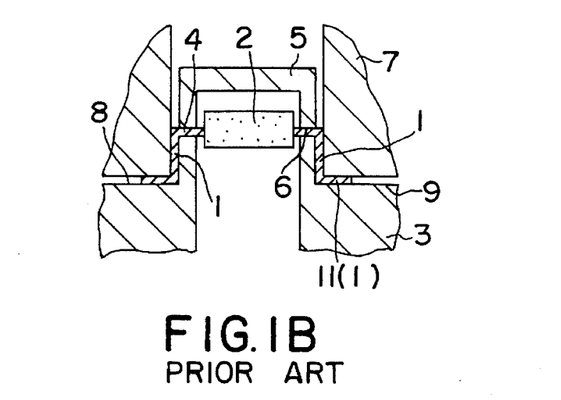
FIG. 1B is a cross sectional side view of the shaping mold and the semiconductor device showing a shaping operation.
Figure 1C:
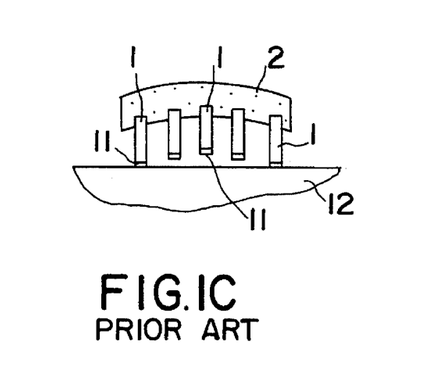
FIG. 1C is a front view of the semiconductor device with external leads shaped.
Figure 1D:
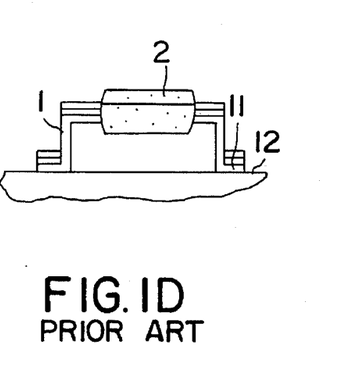
FIG. 1D is a side view of the semiconductor device in FIG. 1C.

FIG. 1A is a perspective view of mold halves for shaping external leads of a semiconductor device called SOP (Small outline Package) and the semiconductor device before its external leads are shaped and FIG. 1B is a cross sectional side view thereof showing the shaping. Further, FIG. 1C is a front view of the semiconductor device after its external leads are shaped and FIG. 1D is a side view thereof.

In FIGS. 1A to 1D, a punch 7 is lowered to press the external leads 1 down with root portions of the external leads 1 protruding from the plastic seal portion 2 being fixed in between lead pressing faces 6 of an upper mold half 5 and lead pressing faces 4 of a lower mold half 3. With a further downward movement of the punch 7, end portions 11 of the external leads 1 are pressed between a lower face 9 of the punch 7 and a lead end pressing face 8 of the lower mold half 3, resulting in gull wing shape external leads 1. That is, the external lead 1 protruding from a side face of the plastic seal portion 2 is bent down at right angle at its root portion and then bent at right angle at its end portion 11 so that the latter becomes in parallel to a main surface of the plastic seal portion 2. The end portion 11 is bonded to a conductive layer pad (not shown) of a printed circuit board 12.

It has been known, however, that the plastic seal portion 2 may be considerably warped as shown in FIG. 1A. Such warpage may be caused by difference in shrinkage between the lead frame and the sealing plastic material and/or between an upper and a lower plastic material portions, etc.

When the above-mentioned shaping procedure is applied to the external leads 1 of such warped plastic seal portion 2, the warp is temporarily corrected or removed during the shaping process of the external leads 1 shown in FIG. 1B and, therefore, the end portions 11 of the external leads 1 are formed equidistantly from the plastic seal portion 2 since the pressing face 6 of the upper mold half 5 and the pressing face 4 of the lower mold half 3 are flat. However, since the warp is restored at a time when the plastic seal portion 2 is removed from the lead shaping mold halves, the end portions 11 of the external leads 1 having gull wing shape are deviated according to the warp. As a result, the end portions 11 of the external leads 1 are not in a common plane as shown in FIG. 1C and, therefore, there may be unsatisfactory connection between the conductive layer pad formed on the printed circuit board 12 and the end portions 11 when the semiconductor device is actually mounted on the printed circuit board 12. For example, in a case where a lead pitch is 0.5 mm, it is necessary to make a maximum difference in height between end portions of the respective external leads not more then 55 µm. In the conventional case shown in FIG. 1C, however, the difference between the end portions 11 of the outermost external leads 1 and the center external lead 1 becomes larger than 55 µm, causing unacceptable connection between the end portion 11 of the center external lead 1 and the underlying conductive layer pad.

Figure 2A:
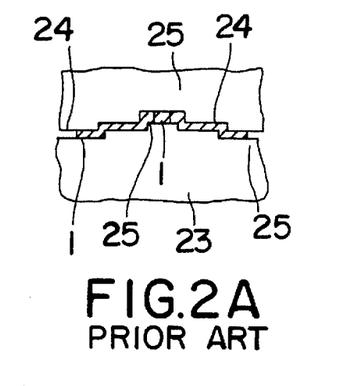
FIG. 2A is a cross sectional side view of a shaping mold and a portion of external leads under shaping operation.
Figure 2B:
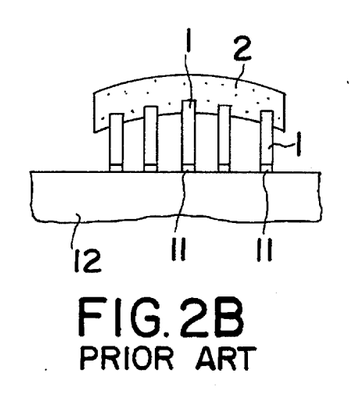
FIG. 2B is a front view of the semiconductor device with external leads shaped.
Figure 2C:
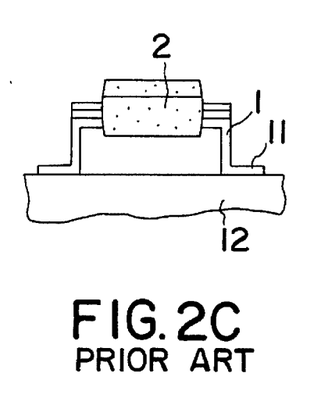
FIG. 2C is a side view of the semiconductor device in FIG. 2B.

A technique for solving this problem is disclosed in Japanese Patent Application Laid-open No. Hei 2-210855 and FIGS. 2A to 2C show the technique. FIG. 2A is a cross sectional side view of a mold and a portion of external leads which is being molded by the mold, FIG. 2B is a front view of a semiconductor device whose leads are molded and FIG. 2C is a side view of the semiconductor device.

In FIG. 2A corresponding to FIG. 1B, a lead pressing face 26 of an upper mold half 25 and a lead pressing face 24 of a lower mold half 23 which are clamping root portions of external leads 1 are stepped correspondingly to an expected warp of a plastic seal portion. Since a length of a center external lead 1 is made longer vertically than those of outermost external leads 1 due to the stepped configuration of the upper and lower pressing faces 24 and 26 of the mold halves 23 and 25 as shown in FIGS. 2B and 2C, end portions 11 of all of the external leads 1 can be in a common plane, resulting in no such problem as encountered in the conventional case shown in FIG. 1D.

However, warping of a plastic seal portion of a semiconductor device and its direction depends upon individual semiconductor devices and, therefore, it is practically impossible to determine the configuration of the pressing faces of the mold halves applicable to all semiconductor devices.

SUMMARY OF THE INVENTION

An object of the present invention is, therefore, to provide a practical method of manufacturing a plastic seal semiconductor device without the conventional problem of unacceptable connection of the semiconductor device to a printed circuit board when the semiconductor device is mounted thereon and an apparatus for performing the same method.

The feature of the present invention resides in a method of manufacturing a plastic seal semiconductor device comprising the steps of:

mounting a semiconductor element on a predetermined location on a lead frame, connecting connection regions of a plurality of leads of the lead frame to a plurality of connecting portions of the semiconductor element by means of thin metal wires and sealing the semiconductor element, the thin metal wires, the connecting regions of the leads and peripheral areas thereof by a plastic seal portion;

correcting warp of main surfaces of the plastic seal portion;

separating an intermediate product of the plastic seal semiconductor device from the lead frame, the intermediate product being prepared by cutting the plurality of leads at respective predetermined positions so that the plurality of leads having respective predetermined lengths extend from side faces of the corrected plastic seal portion; and shaping the plurality of leads of the intermediate product separated from the lead frame.

The step of correcting warp of the plastic seal portion includes a first step of clamping the main surfaces of the plastic seal portion with flat faces of a pair of members and pressing the main surfaces while heating them and a second step of clamping the main surfaces of the plastic seal portion with flat faces of a pair of members and pressing the main surfaces while cooling the main surfaces of the plastic seal portion. Preferably, there is a transportation step of transporting the lead frame provided between the first and second steps. Heating process in the first step may be performed by a heater block and cooling process in the second step may be performed by a heat sink. One of the members used in the first step may comprise a transporting plate for mounting and transporting the lead frame and the other member may comprise the heater block. An upper surface of the transporting plate and a lower surface of the heater block are the flat faces. One of the members used in the second step may comprise the same transporting plate as used in the first step and the other member may be the heat sink having flat lower surface. Preferably, a lead frame mounting a plurality of plastic seal portions is intermittently transported through a plurality of pressing/heating stages to perform the first step for the respective plastic seal portions sequentially and then transported intermittently through a plurality of pressing/cooling stages to perform the second step sequentially.

Another feature of the present invention resides in an apparatus for performing the above-mentioned method. The apparatus comprises:

a pair of upper and lower flat face means for clamping main surfaces of a plastic seal portion on a lead frame by molding a semiconductor element; and pressing means for pressing the main surfaces of the plastic seal portion through the flat face means, to correct warp of the main surfaces of the plastic seal portion.

It is preferable that the apparatus further comprises heating means for heating the plastic seal portion so that the pressing means presses the main surfaces of the plastic seal portion at an elevated temperature. The heating means may be constituted with an upper and lower heater blocks arranged above and below the upper and lower flat face means, respectively, and the pressing means comprises a weight mounted on the upper heater block and exerting gravity force on the main surface of the plastic seal portion through the upper heater block and the upper flat face means. The upper flat face means comprises a flat lower surface of the upper heater block which is in contact with the plastic seal portion and the lower flat face means comprises an upper flat surface of the transporting plate for mounting and transporting a lead frame. The upper heater block may be composed of a main body including heat generating means and a lower portion providing a flat lower surface. The main body and the lower portion may be prepared separately. Alternatively, they may be constituted integrally. It is preferable that flatness of a flat face of the flat face means is less than 15 μm in height difference.

Another feature of the present invention resides in an apparatus for manufacturing a plastic seal semiconductor device, which comprises a first correcting portion including a pair of upper and lower heater blocks clamping main surfaces of a plastic seal portion formed on a lead frame by molding a semiconductor element and a first pressing means for exerting pressure onto the main surfaces of the plastic seal portion and a second correcting portion including a pair of upper and lower heat sinks clamping the main surfaces of the plastic seal portion and a second pressing means for exerting pressure onto the main surface of the plastic seal portion through the heat sinks. In the first correcting portion, the main surfaces of the plastic seal portion is pressed by the first pressing means while being heated by the heater blocks and then the plastic seal portion is transferred to the second correcting portion in which the main surfaces of the plastic seal portion is pressed by the second pressing means while the plastic seal portion heated in the first correcting portion is cooled by the heat sinks of the second correcting portion. It is preferable that the first correcting portion includes a plurality of pressing/heating stages each including the pair of heater blocks and the first pressing means and the second correcting portion includes a plurality of pressing/cooling stages each including the pair of heat sinks and the second pressing means, so that, in the first correcting portion, a lead frame mounting a plurality of plastic seal portions is intermittently transported through the plurality of the pressing/heating stages to perform the heating and pressing operations for the respective plastic seal portions sequentially and then, in the second correcting portion, they are transported intermittently through the plurality of the pressing/cooling stages to perform the pressing and cooling operations for the respective plastic seal portions sequentially.

BRIEF DESCRIPTION OF THE DRAWINGS

The above-mentioned and other object is, features and advantages of the present invention will become more apparent by reference to the following detailed description of the invention taken in conjunction with the accompanying drawings, wherein:

FIGS. 1A to 1D show a conventional technique, in which

FIGS. 2A to 2C show another conventional technique, in which

FIGS. 9A to 9D show the steps from an intermediate product of a semiconductor device obtained by an embodiment of the present invention to a finished semiconductor device, in which

DETAILED DESCRIPTION OF THE PREFERRED EMBODIMENT

The present invention will be described with reference to the drawings.

Figure 3:
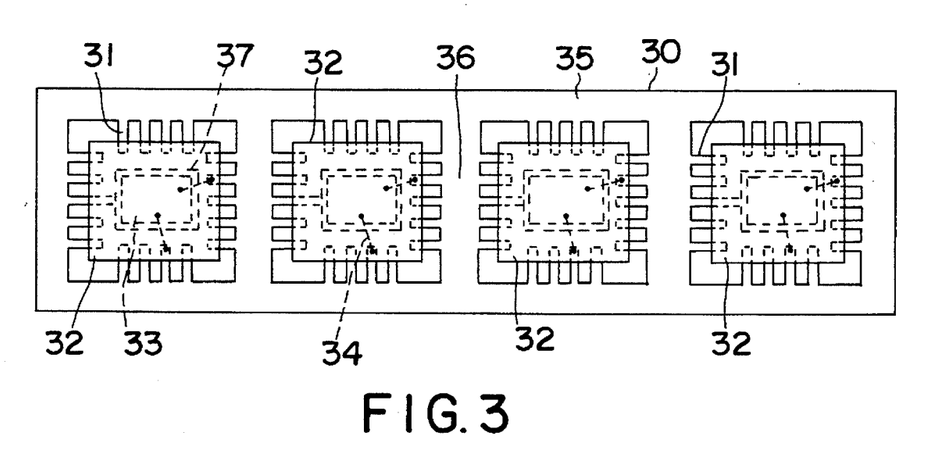
FIG. 3 is a plan view of a lead frame on which plastic seal portions are formed, according to an embodiment of the present invention.

FIG. 3 is a plan view of a lead frame 30 and plastic seal portions 32 molded on the lead frame after aging for stabilizing plastic material thereof. Semiconductor elements 33 are mounted on element mounting portions 37 of the lead frame 30, which is formed from a copper or copper alloy plate 0.125 mm thick, respectively, with connecting regions of end portions of a plurality of leads 31 extending inwardly from an outer frame 35 and support portions 36 of the lead frame being bonded to a plurality of connecting portions, that is, bonding pads, of each semiconductor element by thin metal wires 34. It should be noted that, in FIG. 3, only two thin metal wires are shown for each semiconductor element for simplicity of illustration. The semiconductor element, together with portions of the thin metal wires and at least the connecting regions of the leads, is molded with plastic material by fixing tightly the lead frame between plastic mold halves of a mold, injecting thermo-plastic resin material the plastic material into the mold, allowing it to be hardened and aging it to stabilize the resin material, resulting in plastic seal portions 32. Portions of the leads 31 within the plastic seal portion 32 are internal leads and portions thereof protruding externally of the plastic seal portion 32 are external leads.

The semiconductor device according to this embodiment is of QFP (Quad Flat Package) type in which leads are derived from all of four sides of the plastic seal portion. In a case of 304-pin type, 76 leads 31 each 0.2 mm wide are arranged in and derived from each side of the plastic seal portion with pitch of 0.5 mm. The plastic seal portion 32 in this case has an area of 40 mm×40 mm and thickness of 3.7 mm.

Figure 4A:
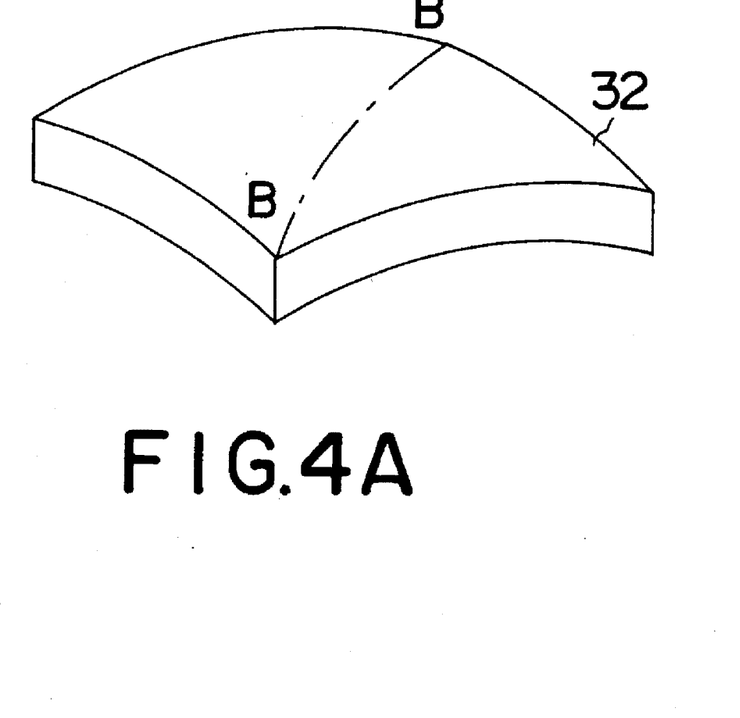
FIG. 4A is a perspective view of a plastic seal portion shown in FIG. 3
Figure 4B:
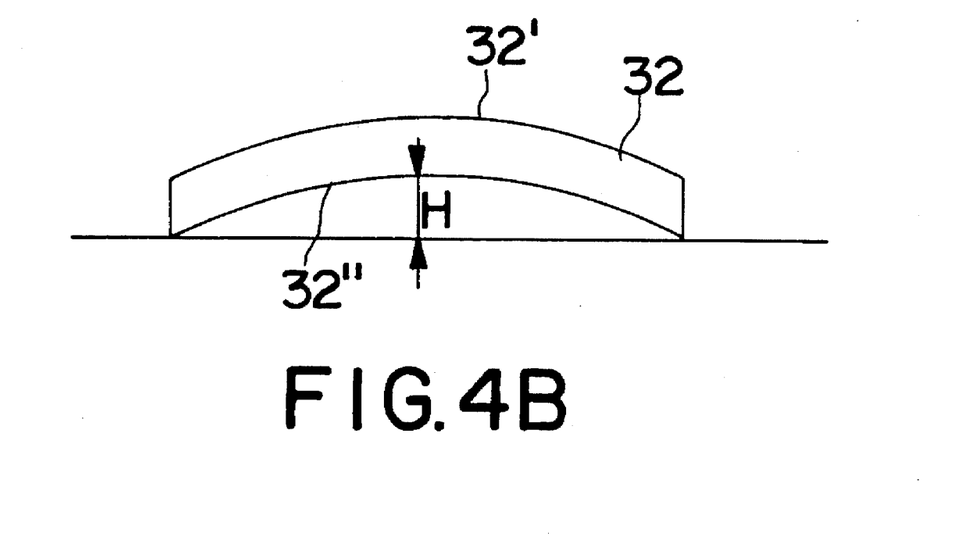
FIG. 4B is a cross section taken along a line B—B in FIG. 4A.

The plastic seal portion 32 on the lead frame has one (32') of main surface which is convex and another main surface 32" which is concave as shown in enlarged scale in FIGS. 4A and 4B, respectively, and a height difference H is 80 μm at most. If the leads were shaped under this condition, there could be unacceptable lead connections since the height difference between a printed circuit board and end portions of leads becomes as large as 80 μm. On the other hand, if, in order to avoid such unacceptable lead connection, a solder layer on the printed circuit board were made thicker, there could be short-circuits of a wiring pattern on the printed circuit board.

Therefore, in this embodiment, the warp of the plastic seal portion 32 is corrected by using the steps shown in FIGS. 5 to 8.

Figure 5:
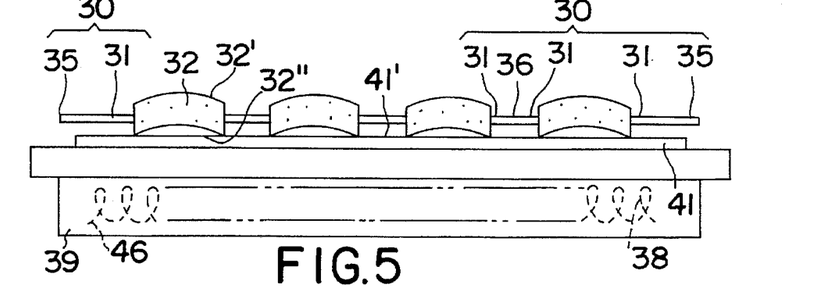
FIGS. 5 to 8 are side views of a semiconductor device in the order of processing steps according to an embodiment of the present invention.

In FIG. 5, the lead frame 30 holding the warped plastic seal portions 32 is put on a transporting plate 41 of aluminum which is, in turn, put on a heater block 39 of stainless steel including a heater 38 to pre-heat the plastic seal portions 32. Flatness of an upper surface 41' of the transporting plate 41 which is in contact with the lower main surfaces 32" is not more than 15 μm in height difference.

Figure 6:
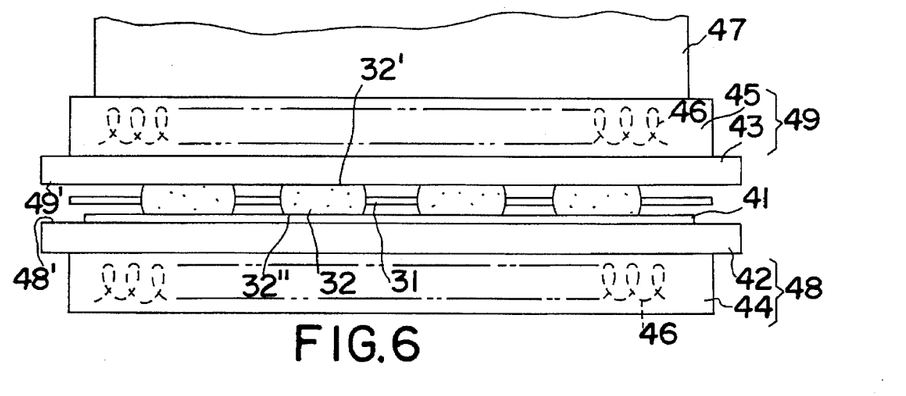

Then, as shown in FIG. 6, the lead frame 30 having the plastic seal portions 32 mounted on the transporting plate 41 and pre-heated is transferred onto an upper surface 48' of a lower heater block 48 and an upper heater block 49 is put on the lead frame 30 with a lower surface 49' of the upper heater block 49 being in contact with the upper main surfaces 32' of the plastic seal portions 32. The lower heater block 48 includes a main body 44 of stainless steel having a heater 46 therein and an upper plate 42 of stainless steel having an upper surface 48'. The main body 44 and the upper plate 42 may be provided integrally or provided separately from each other. Similarly, the upper heater block 49 includes a main body 45 of stainless steel having a heater 46 therein and a lower plate 43 of stainless steel having a lower surface 49'. The main body and the lower plate may be provided integrally or provided separately from each other. The upper surface 48' of the lower heater block 48 and the lower surface 49' of the upper heater block 49 are flat. Particularly, flatness of the lower surface 49' of the upper heater block 49 which is in contact with the upper main surfaces 32' of the plastic seal portions 32 is made less than 15 μm in height difference.

A weight 47 is put on the upper heater block 49 which is enough to exert gravity force corresponding to pressure as high as about 125 g/cm$^2$. Correction of warp of the plastic seal portions is performed in atmosphere by applying the pressure due to the weight 47 on the upper main surfaces 32' of the plastic seal portions 32 through the upper heater block 49 while maintaining the plastic seal portions 32 at 150°±5° C. by the heaters 46 under the state shown in FIG. 6. Thereafter, the upper heater block 49 and the weight 47 are lifted up and the transporting plate 41 mounting the lead frame 30 including the plastic seal portions 32 is removed.

Figure 7:
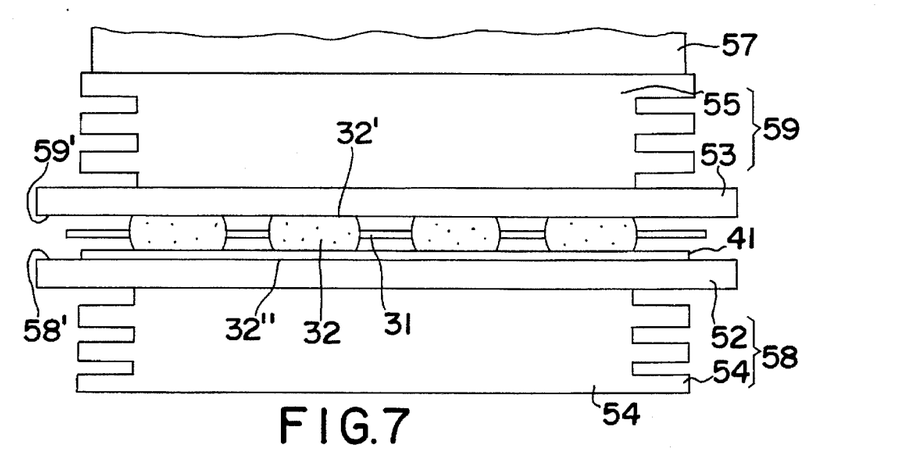

Then, as shown in FIG. 7, the transporting plate 41 on which the lead frame 30 and the plastic seal portions 32 are mounted is put on an upper surface 58' of a lower heat sink 58 and an upper heat sink 59 is put on the lead frame 30 with a lower surface 59' of the upper heat sink 59 being in contact with the upper main surfaces 32' of the plastic seal portions 32 on the transporting plate 41. The lower heat sink 58 is composed of a main body 54 having heat radiation fins formed and an upper plate 52 having an upper surface 58' which may be formed integrally with each other or separably from each other. Similarly, the upper heat sink 59 is composed of a main body 55 having heat radiation fins formed and a lower plate 53 having a lower surface 59' which may be formed integrally with each other or separably from each other. The upper surface 48' of the lower heater block 48 and the lower surface 49' of the upper heater block 49 are flat. Particularly, flatness of the lower surface 49' of the upper heater block 49 which is in contact with the upper main surfaces 32' of the plastic seal portions 32 is made less than 15 μm in height difference. A weight 57 is put on the upper heater block 59. Correction of warp of the plastic seal portions is performed in atmosphere by applying the pressure due to the weight 57 on the upper main surfaces 32' of the plastic seal portions 32 which are heated to 150° C. in the step shown in FIG. 6 through the upper heat sink 59 while being cooled by the upper and lower heat sinks 59 in the step shown in FIG. 7 and, then, the upper heat sink 59 and the weight 57 are lifted up and the transporting plate 41 mounting the lead frame 30 including the plastic seal portions 32 is derived.

Figure 8:
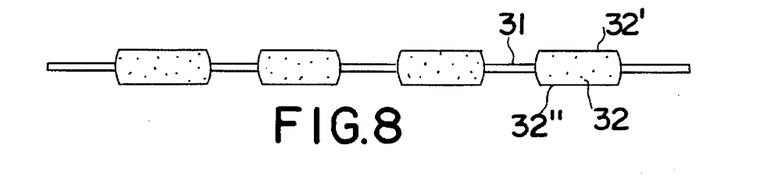
Figure 9A:
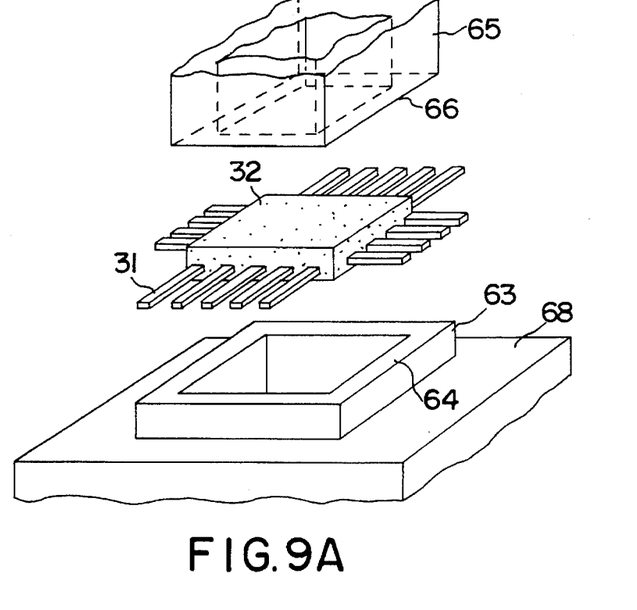
FIG. 9A is a perspective view of a shaping mold for shaping external leads and a semiconductor device before shaping.
Figure 9B:
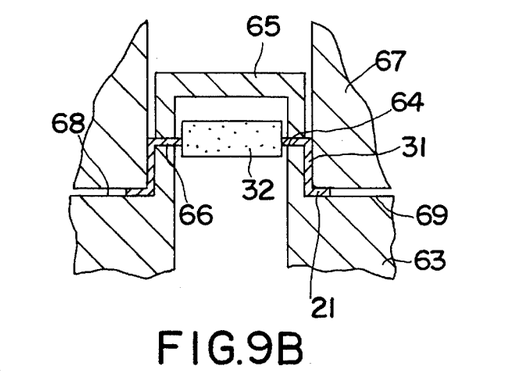
FIG. 9B is a cross sectional side view of the shaping mold and the semiconductor device showing a shaping operation.
Figure 9C:
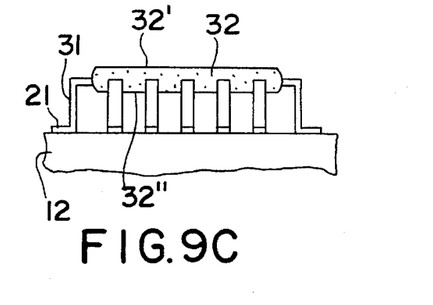
FIG. 9C is a front view of the semiconductor device with external leads shaped.
Figure 9D:
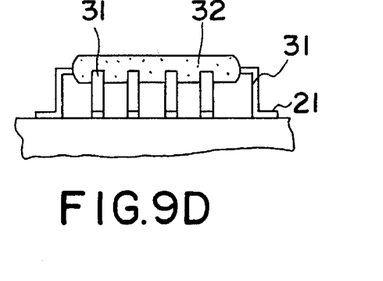
FIG. 9D is a side view of the semiconductor device in FIG. 9C.

The plastic seal portions 32 whose warp is thus removed become flat as shown in FIG. 8. For example, the warping of 80 μm in the state shown in FIG. 5 can be reduced to 40 μm or less. Thereafter, tie-bars are cut out and unnecessary resin portions of the plastic seal portion 32 is removed. Then, the external leads are externally processed by such as solder plating and then the plastic seal portions are separated from the lead frame.

Intermediate products of semiconductor devices having a number of external leads 31 derived from the side faces of the plastic seal portions 32 whose warp is corrected and extending in parallel to the main surfaces 32' and 32" of the plastic seal portions are obtained as a result of this separating step.

These external leads 31 are shaped as shown in FIGS. 9A to 9D, resulting in complete semiconductor devices. That is, root portions of the external leads 31 extending from the plastic seal portion 32 are fixed between a flat lead pressing face 66 of an upper mold half 65 and a flat lead pressing face 64 of a lower mold half 63 and a punch 67 is lowered to press the external leads 31 down. With a further downward movement of the punch 67, end portions 21 of the external leads 31 are pressed between a lower face 69 of the punch 67 and a flat lead end pressing face 68 of the lower mold half 63, resulting in gull wing shape external leads 31. That is, the external lead 31 protruding from a side face of the plastic seal portion 32 is bent down at right angle at its root portion and then bent at a position lower than the lower main surface 32" of the plastic seal portion 32 by 0.4 mm at right angle so that the end portion 21 of the plastic seal portion 32 which is 0.5 mm long becomes in parallel to the main surface 32" of the plastic seal portion 32. The end portion 21 is bonded to a conductive layer-pad (not shown) of a printed circuit board 12. In this embodiment, since warp of the plastic seal portion 32 is corrected by the correcting step and flattened, the difference in height between the end portions 21 of the 304 external leads 31 becomes 55 um or less and thus there is no unacceptable connection of the end portions 39 of the external leads 31 to the conductive layer pads formed on the printed circuit board 12 when the semiconductor device of QFP type is actually mounted thereon.

An example of an automatic manufacturing apparatus for mass-production of plastic seal type semiconductor devices by using the above-mentioned embodiments will be described with reference to FIG. 10.

Figure 10:
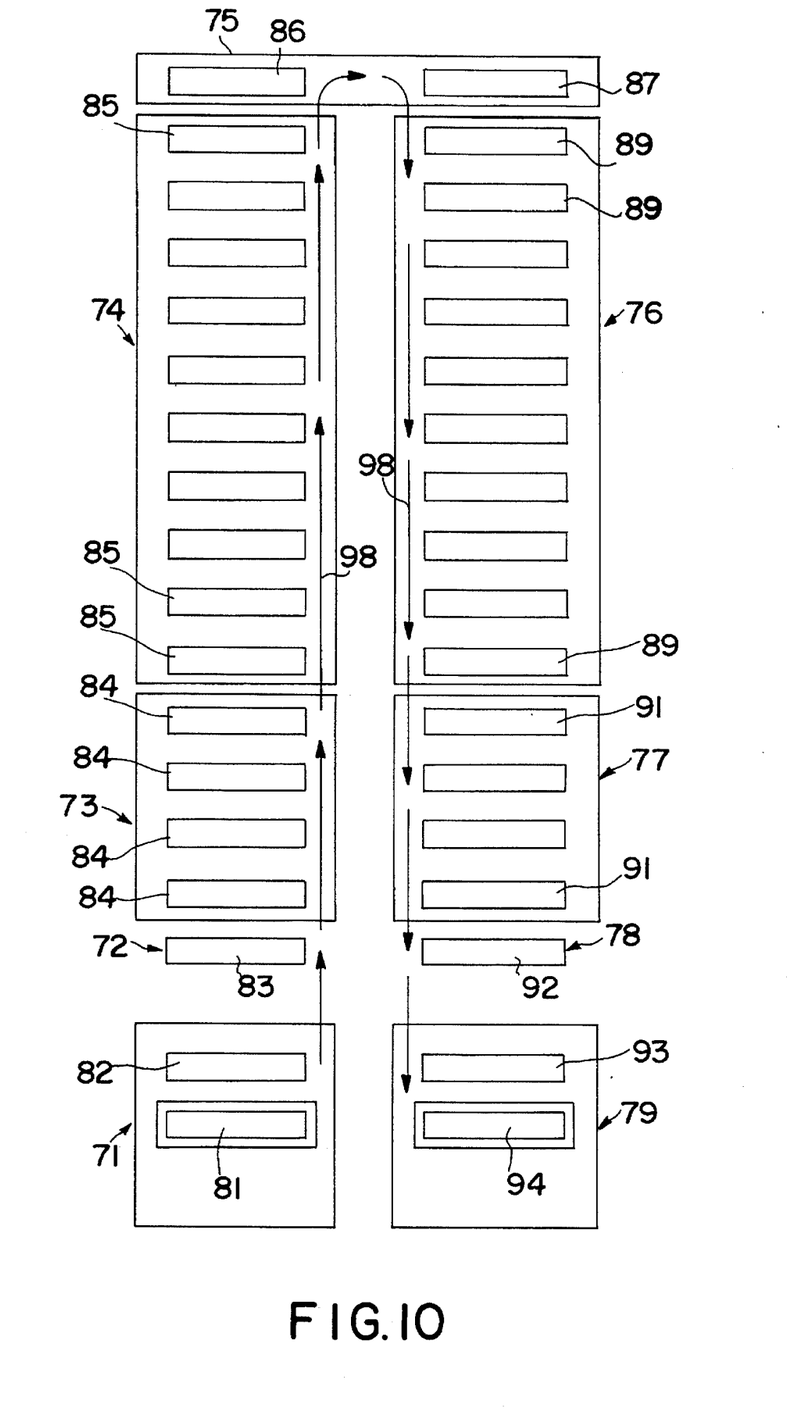
FIG. 10 is a schematic plan view showing an example of a manufacturing apparatus suitable for mass-production of semiconductor device, according to another embodiment of the present invention.

The mass-production apparatus shown in FIG. 10 comprises a supply portion 71 including an elevator 81 and a stage 82, a front transporting portion 72 including a stage 83, a pre-heating portion 73 including four stages 84, a pressing/heating portion 74 including ten stages 85, an intermediate transporting portion 75 including stages 86 and 87, a pressing/cooling portion 76 including ten stages 89, a gradual cooling portion 77 including four stages 91, a rear transporting portion 78 including a stage 92 and a storage portion 79 including a stage 93 and an elevator 94. The mechanism shown in FIG. 5 is arranged on each of the four stages 84 of the pre-heating portion 73 and the mechanism shown in FIG. 6 is arranged on each of the 10 stages 85 of the pressing/heating portion 74. The mechanism shown in FIG. 7 is arranged on each of the 10 stages 89 of the pressing/cooling portion 76 and the mechanism shown in FIG. 7 without the upper heat sink 59 and the weight 57 is arranged on each of the four stages 91 of the gradual cooling portion 77. Vertical movement of the upper heater block, the upper heat sink and the weight in the related stages, temperature control, movement of the lead frame and mounting thereof on the related stages, deriving the lead frame having the plastic seal portions from and storing it are fully automated. A number of the lead frames 30 each having the plastic seal portions 32 as shown in FIG. 3 are stacked in a magazine case and derived from the magazine case one by one while being lifted by the elevator 81 and mounted on the transporting plate 41 (FIGS. 5 to 7) in the stage 82. The lead frames 30 on the transporting plates 41 are intermittently fed by a robot in a direction shown by an arrow 98 through the respective stages and warp of the plastic seal portions 32 on each lead frame 30 is corrected by the functions of the respective stages. The lead frames 30 whose plastic seal portions 32 are corrected as shown in FIG. 8 are moved from the transporting plates sequentially in the stage 93 and lowered by the elevator 94.

Assuming that each lead frame 30 stays 30 seconds in each stage and a transportation of a lead frame between adjacent stages takes 5 seconds, time necessary in the pre-heating portion 73 is 30 seconds×4=120 seconds =2 minutes, time necessary in the pressing/heating portion 74 is 30 seconds×10=300 seconds=5 minutes, time necessary in the pressing/cooling portion 76 is 30 seconds×10=300 seconds=5 minutes and time necessary in the gradual cooling portion 77 is 30 seconds×4=120 seconds=2 minutes. Since there are 34 stages in this system, it takes about 20 minutes from deriving the lead frame from the magazine case of the elevator 81 through the warp correction to the storing in the magazine case of the elevator 94. However, since the lead frames are sequentially fed, each lead frame having plastic seal portions whose warp is corrected can be obtained within 35 seconds.

Figure 11:
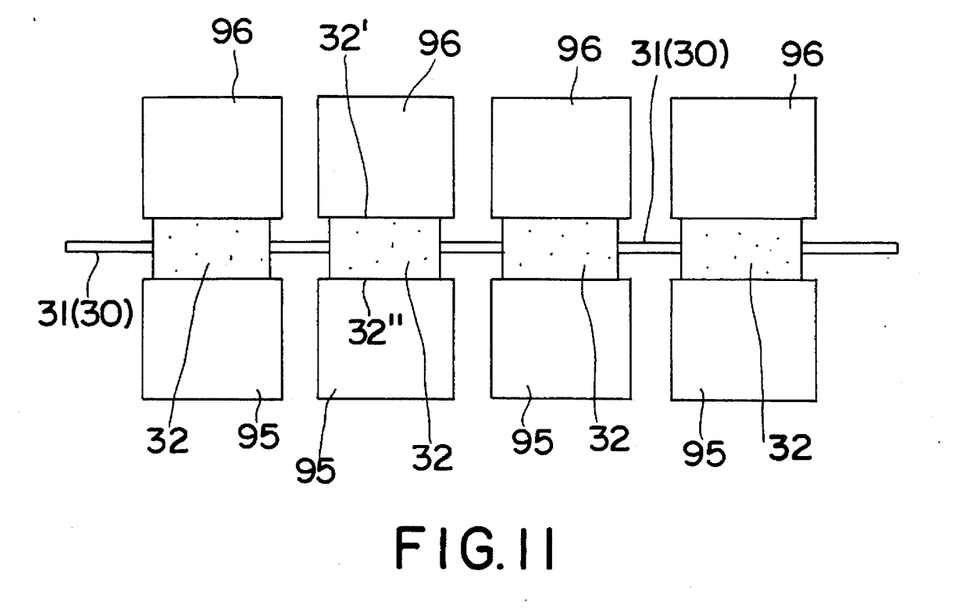
FIG. 11 is a side view of a modification of the embodiment of the present invention.

FIG. 11 shows a modification of the embodiment shown in FIG. 10. As mentioned, in the embodiment shown in FIG. 10, the upper and lower heater blocks and the upper and lower heat sinks cover 4 plastic seal portions on the lead frame and the upper surface of the transporting plate is used as the flat face means. In the modification shown in FIG. 11, one member 96 of the flat surface means of the upper heater block and/or the upper heat sink is divided to four segments which are made in contact with the respective upper main surfaces 32' of four plastic seal portions 32 and the other member 95 of the flat surface means of the lower heater block and/or lower heat sink is also divided similarly and resultant four segments are made in contact with the lower main surfaces 32" of the respective plastic seal portions 32. With this construction, it is possible to individually control the flatness of the plastic seal portion in the respective steps according to the degree of warping thereof although the mechanisms in the respective steps become complicated to some extent. It should be noted that the modification shown in FIG. 11 can be also applied to the automatic plastic sealing apparatus such as shown in FIG. 10.

As described hereinbefore, according to the present invention, the shaping step for the external leads is performed after the warp correction step. Therefore, it is possible to shape the external leads suitable by means of a usual shaping mold regardless of configuration of the individual plastic seal portions and thus it is possible to solve the problem of unacceptable connection of the external leads to the bonding pads formed on the printed circuit board when the semiconductor devices are actually mounted thereon.

Although the present invention has been described with reference to a specific embodiment, this description is not meant to be construed in a limiting sense. Various modifications of the disclosed embodiment, as well as other embodiments of the present invention, will become apparent to persons skilled in the art upon reference to the description of the present invention. It is therefore contemplated that the appended claims will cover any modifications or embodiments within the true scope of the present invention.

What is claimed is:

1. A method of manufacturing a plastic seal semiconductor device, comprising the steps of:

mounting a plurality of semiconductor elements in spaced relation on a single lead frame, connecting connection regions of a plurality of leads of said lead frame to a plurality of connecting portions of said semiconductor elements by thin metal wires, and forming plastic seal portions each surrounding each of said semiconductor elements, said thin metal wires, said connection regions of said leads and peripheral areas thereof;

correcting warpage of upper and lower main surfaces of said plastic seal portions by clamping said plastic seal portions within said single lead frame between upper and lower heating plates of a heating device while applying heat to said plastic seal portions through said heating plates, transporting said single lead frame from said heating device to a cooling device comprising upper and lower cooling plates, and clamping said plastic seal portions between said upper and lower cooling plates;

separating an intermediate product of a plurality of plastic seal semiconductor devices from said lead frame, said intermediate product being prepared by cutting the plurality of leads to separate the plurality of said semiconductor elements from one another; and shaping the plurality of said leads of said intermediate products separated from said lead frame, wherein said lead frame is transported between said heating device and said cooling device on a transporting plate through which heat is applied to lower surfaces of said semiconductor elements in said heating device and through which heat is extracted from said lower surface of said semiconductor elements in said cooling device.

2. The method according to claim 1, wherein said cooling device comprises a heat sink.

3. The method according to claim 1, wherein said heating device comprises a pair of heater blocks each formed integrally with a respective one of said upper and lower heating plates.

4. The method according to claim 1, wherein said cooling device comprises a pair of heat sinks each formed integrally with a respective one of said upper and lower cooling plates.

5. The method according to claim 1, wherein a series of said heating devices followed by a series of said cooling devices are provided, and wherein a corresponding plurality of said lead frames are acted on serially by each of said heating devices and cooling devices.

6. The method according to claim 1, wherein said shaping step comprises bending external leads, said external leads extending from side surfaces of said plastic seal portions at root portions thereof and further bending said external leads at outward portions thereof such that end portions of said external leads extend parallel to said lower main surface of said plastic seal portions.

7. The method according to claim 6, wherein said external leads extend from four side surfaces of said plastic seal portions.

8. The method according to claim 1, wherein said plastic seal portion is made of thermoplastic epoxy resin.

9. A method of manufacturing a semiconductor device comprising the steps of:

sealing each of a plurality of semiconductor elements mounted on a single lead frame with a resin and hardening said resin to form an intermediate device, said intermediate device thereby having a plurality of plastic seal portions each containing an associated one of said semiconductor elements therein, at least one of said plastic seal portions being warped to have a warped surface;

placing said intermediate device on a transporting plate;

moving said transporting plate having thereon said intermediate device into a heating device having a pair of heating plates;

clamping and heating said plastic seal portions of said intermediate device in parallel to one another by said pair of heating plates with said transporting plate inserted between one of said pair of heating plates and each of said plastic seal portions;

taking out said transporting plate having thereon said intermediate device from said heating device and then moving said transporting plate having thereon said intermediate device into a cooling device having a pair of cooling plates; and clamping and cooling said plastic seal portions of said intermediate device in parallel to one another by said pair of cooling plates with said transporting plate inserted between one of said cooling plates and each of said plastic seal portions;

whereby said warped surface of said at least one of said plastic seal portions is corrected to a substantially flat surface.

* * * * *